United States Patent
Miwa

(10) Patent No.: US 11,631,597 B2
(45) Date of Patent: Apr. 18, 2023

(54) HOLDING APPARATUS

(71) Applicant: NGK SPARK PLUG CO., LTD., Nagoya (JP)

(72) Inventor: Kaname Miwa, Nagoya (JP)

(73) Assignee: NGK SPARK PLUG CO., LTD., Aichi (JP)

( * ) Notice: Subject to any disclaimer, the term of this patent is extended or adjusted under 35 U.S.C. 154(b) by 705 days.

(21) Appl. No.: 16/481,676

(22) PCT Filed: Jan. 31, 2018

(86) PCT No.: PCT/JP2018/003251
§ 371 (c)(1),
(2) Date: Jul. 29, 2019

(87) PCT Pub. No.: WO2018/143288
PCT Pub. Date: Aug. 9, 2018

(65) Prior Publication Data
US 2020/0006095 A1   Jan. 2, 2020

(30) Foreign Application Priority Data
Feb. 1, 2017 (JP) .............................. JP2017-016751

(51) Int. Cl.
*H01L 21/02* (2006.01)
*H01L 21/67* (2006.01)
(Continued)

(52) U.S. Cl.
CPC .. *H01L 21/67098* (2013.01); *H01L 21/67103* (2013.01); *H01L 21/6831* (2013.01);
(Continued)

(58) Field of Classification Search
None
See application file for complete search history.

(56) References Cited

U.S. PATENT DOCUMENTS 6,632,512 B1    10/2003   Ito
7,279,661 B2 *  10/2007   Okajima .................. H05B 3/68
                                                    219/444.1
(Continued)

FOREIGN PATENT DOCUMENTS

CN      102362332 A    2/2012
JP      5-234666 A     9/1993
(Continued)

OTHER PUBLICATIONS

Communication dated Apr. 24, 2018 issued by the International Searching Authority in counterpart Application No. PCT/JP2018/003251 (PCT/ISA/210).
(Continued)

*Primary Examiner* — Joseph M. Pelham
(74) *Attorney, Agent, or Firm* — Sughrue Mion, PLLC

(57) ABSTRACT

A holding apparatus including a holding substrate having a first main face on one side in a thickness direction thereof, and a heat generation section which is disposed in the holding substrate and generates heat when energized. The heat generation section includes a plurality of first heating elements arrayed in a planar direction orthogonal to the thickness direction of the holding substrate, and a second heating element disposed on a side toward the first main face in the thickness direction with respect to the plurality of first heating elements. Any one of the plurality of first heating elements is electrically connected to the second heating element in series through a first via extending in the thickness direction within the holding substrate.

16 Claims, 8 Drawing Sheets

(51) Int. Cl.
  *H01L 21/683* (2006.01)
  *H05B 3/06* (2006.01)
  *H05B 3/10* (2006.01)
  *H05B 3/28* (2006.01)
  *H05B 3/74* (2006.01)
  *H05B 1/02* (2006.01)
  *H05B 3/02* (2006.01)

(52) U.S. Cl.
  CPC .............. *H05B 1/0233* (2013.01); *H05B 3/02* (2013.01); *H05B 3/06* (2013.01); *H05B 3/10* (2013.01); *H05B 3/283* (2013.01); *H05B 3/74* (2013.01); *H01L 21/02* (2013.01)

(56) References Cited

U.S. PATENT DOCUMENTS

| | | |
|---|---|---|
| 2003/0104186 A1 | 6/2003 | Ito |
| 2005/0018379 A1 | 1/2005 | Ito |
| 2005/0173410 A1 | 8/2005 | Okajima et al. |
| 2010/0065542 A1 | 3/2010 | Dubey |
| 2010/0065543 A1 | 3/2010 | Dubey et al. |
| 2011/0092072 A1* | 4/2011 | Singh .................. H01L 21/6833 438/710 |
| 2012/0031889 A1 | 2/2012 | Komatsu |
| 2016/0027678 A1 | 1/2016 | Parkhe et al. |
| 2016/0307787 A1* | 10/2016 | Uemura ............ H01L 21/67103 |
| 2017/0110357 A1* | 4/2017 | Ishikawa ........... H01L 21/67103 |
| 2017/0148657 A1* | 5/2017 | Pape ................. H01L 21/67103 |
| 2017/0167790 A1* | 6/2017 | Gaff ..................... H05B 3/0014 |
| 2017/0280509 A1* | 9/2017 | Takebayashi ....... H01L 21/6833 |
| 2018/0286732 A1* | 10/2018 | Uefuji .................... H05B 3/283 |
| 2021/0274599 A1* | 9/2021 | Uematsu ............. H01L 21/6833 |

FOREIGN PATENT DOCUMENTS

| | | | |
|---|---|---|---|
| JP | 10-22065 A | | 1/1998 |
| JP | 10-199660 A | | 7/1998 |
| JP | 2000-012195 A | | 1/2000 |
| JP | 2002-016072 A | | 1/2002 |
| JP | 2002-160728 A | | 6/2002 |
| JP | 2003-204156 A | | 7/2003 |
| JP | 2005-26045 A | | 1/2005 |
| JP | 2005-166354 A | | 6/2005 |
| JP | 2017228361 A | * | 12/2017 |
| KR | 20-2007-0000529 U | | 5/2007 |
| KR | 10-2011-0053486 A | | 5/2011 |

OTHER PUBLICATIONS

Communication dated Oct. 23, 2020, issued by the Taiwanese Patent Office in counterpart Taiwanese Application No. 107103375.

Communication dated Jan. 28, 2021, from the State Intellectual Property Office of the P.R. of China in Application No. 201880009146.9.

Office Action dated Feb. 23, 2021, issued by the Korean Patent Office in corresponding Korean Patent Application No. 10-2019-7021668.

Communication dated Aug. 18, 2020, issued by the Korean Intellectual Property Office in Korean Application No. 10-2019-7021668.

* cited by examiner

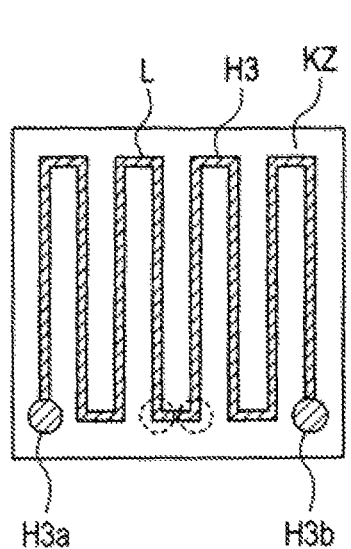
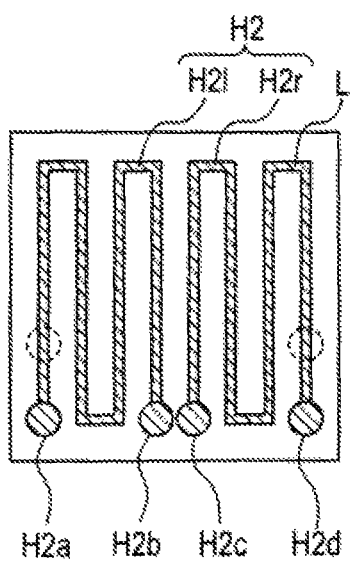
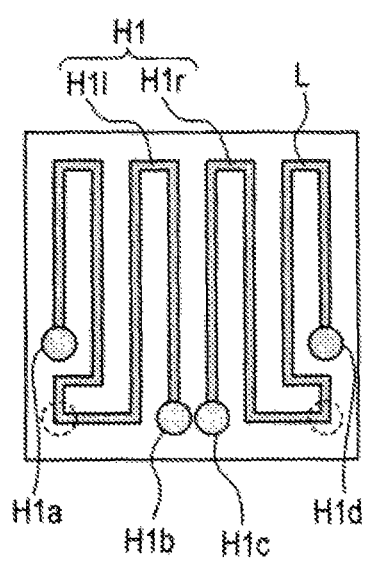
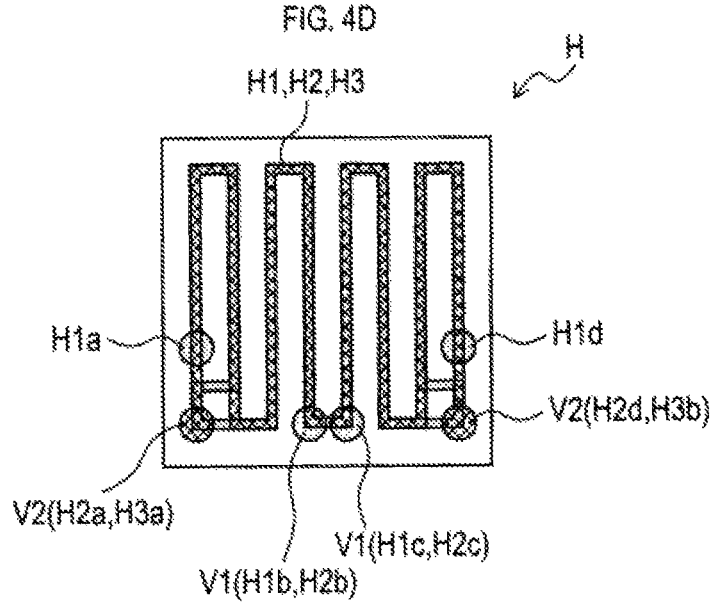

HOLDING APPARATUS

CROSS REFERENCE TO RELATED APPLICATIONS

This application is a 371 or PCT/JP2018/003251 filed Jan. 31, 2018 which claims priority from Japanese Patent Application No. 2017-16751 filed with the Japanese Patent Office on Feb. 1, 2017 and incorporated herein by reference in its entirety.

TECHNICAL FIELD

The present disclosure relates to a holding apparatus which can heat a workpiece such as, for example, a semiconductor wafer.

BACKGROUND ART

Conventionally, in a semiconductor production apparatus, various processes such as dry etching (for example, plasma etching) are performed on a semiconductor wafer (for example, silicon wafer). Reliable fixing of the semiconductor wafer is needed so as to increase the accuracy of the dry etching. In view of this, an electrostatic chuck which fixes a semiconductor wafer by means of electrostatic attraction has been used as a fixing means for fixing a semiconductor wafer.

Some electrostatic chucks have a function of adjusting the temperature of a semiconductor wafer attracted to an attraction surface. For example, there has been known a technique of heating the semiconductor wafer on the attraction surface through use of a ceramic heater which includes a wire-like heating element disposed in a ceramic substrate.

Further, there has been developed a ceramic heater whose ceramic substrate is divided into a plurality of heating zones (i.e., heating regions) in plan view for accurate heating of an electrostatic chuck. Specifically, there has also been proposed a multi-zone ceramic heater in which heating elements capable of heating individual heating zones independently are disposed in the individual heating zones, so as to enhance the temperature adjustment function of the ceramic substrate (see Patent Documents 1 and 2).

In addition, in recent years, there has been increasing demand for a ceramic heater (multi-zone ceramic heater) having an increased number of zones for more accurate temperature control. For example, employment of 100 or more heating zones has been considered.

PRIOR ART DOCUMENTS

Patent Documents

Patent Document 1: Japanese Patent Application Laid-Open (kokai) No. 2005-166354
Patent Document 2: US Patent Application Publication No. 2016/027678

SUMMARY OF THE INVENTION

Problems to be Solved by the Invention

However, in the case where the number of the heating zones is increased, the area of each heating zone decreases. Therefore, there has been a problem in that the resistance of each heating element cannot be increased by, for example, only decreasing the width of the heating element.

Specifically, in order to cause each heating element to generate a predetermined amount of heat, current having a predetermined current value must be supplied to the heating element having a predetermined resistance. Therefore, in the case where the number of the heating zones is very large, a large power supply for supplying a large amount of current is needed, which is not practical.

A conceivable way of suppressing the current value is increasing the resistance of each heating element. However, the resistance cannot be increased to a sufficient degree by, for example, only decreasing the width of the heating element.

In one aspect of the present disclosure, it is desirable to provide a holding apparatus which can increase the resistances of heating elements of its ceramic heater when the number of heating zones of the ceramic heater increases.

Means for Solving the Problems (1) A holding apparatus according to one aspect of the present disclosure comprises a holding substrate having a first main face on one side in a thickness direction thereof, and a heat generation section which is disposed in the holding substrate and generates heat when energized.

In this holding apparatus, the heat generation section includes a plurality of first heating elements arrayed in a planar direction orthogonal to the thickness direction of the holding substrate, and a second heating element disposed on a side toward the first main face in the thickness direction with respect to the plurality of first heating elements. Any one of the plurality of first heating elements is electrically connected to the second heating element in series through a first via extending in the thickness direction within the holding substrate.

The present holding apparatus has a structure in which a plurality of first heating elements are arrayed in the planar direction of the holding substrate. Namely, this holding apparatus is a multi-zone holding apparatus which has a large number of heating zones arrayed in the planar direction so as to correspond to the first heating elements.

This multi-zone holding apparatus includes a plurality of first heating elements, and a second heating element disposed on the first main face side with respect to the plurality of first heating elements. Namely, the plurality of first heating elements and the second heating element are disposed at different positions in the thickness direction. One of the plurality of first heating elements is electrically connected to the second heating element in series through a first via. Therefore, the resistance of a heating element (hereinafter may be referred to as a series heating element) formed by connecting the one of the plurality of first heating elements to the second heating element can be increased.

Namely, in such a multi-zone holding apparatus having a large number of heating zones in plan view, when the number of the heating zones increases, the area of each heating zone decreases. Therefore, increasing the resistance of each single heating element is not easy. In contrast, in the present holding apparatus, even when the area of a single heating zone in plan view decreases, the resistance of the series heating element disposed in each single heating zone can be increased easily. Namely, since the plurality of first heating elements and the second heating element are disposed at different positions in the thickness direction, the resistance of the series heating element can be increased without increasing the area in plan view occupied by each series heating element.

Therefore, even when the current value of current supplied to the series heating element is decreased, a target heat generation amount can be secured. Thus, a remarkable effect of downsizing the apparatus for supplying the current is attained.

Notably, in this holding apparatus, the plurality of first heating elements and the second heating element are disposed at different positions in the thickness direction. Therefore, in the case where the holding substrate has first and second main faces located on opposite sides in the thickness direction, the second heating element may be disposed on the first main face side or the second main face side with respect to the plurality of first heating elements. For example, in the case of a ceramic heater of an electrostatic chuck or the like, the second heating element may be disposed on the attraction surface side or on the side opposite the attraction surface side.

In this holding apparatus, a plurality of first heating elements are disposed. Therefore, there can be employed, for example, a structure in which a second heating element is individually connected to each first heating element. Notably, in addition to a structure in which respective second heating elements are connected to all of the plurality of first heating elements, there can be employed a structure in which respective second heating elements are connected to a portion (i.e., one or some) of the plurality of first heating elements (the same shall apply hereinafter).

(2) The above-described holding apparatus may be configured such that the holding substrate is divided into a plurality of heating zones in plan view in the thickness direction, and the one of the plurality of first heating elements and the second heating element are disposed in at least one of the plurality of heating zones.

Accordingly, when electricity is supplied in each heating zone to, for example, a predetermined first heating element and a predetermined second heating element connected to the first heating element, the temperature of the heating zone can be individually controlled by controlling the state of energization (for example, current, voltage, etc.).

(3) The above-described holding apparatus may comprise a conductive section for electricity supply electrically connected to terminal which receive externally supplied electric power, wherein the conductive section for electricity supply includes an electricity supply via electrically connected to the one of the plurality of first heating elements, an electrically conductive internal wiring layer electrically connected to the electricity supply via, and a terminal-side via electrically connected to the internal wiring layer and electrically connected to the terminal.

By virtue of this configuration, electric power supplied from the outside (i.e., the terminal) can be supplied to the one of the plurality of first heating elements (accordingly, the heat generation section) through the terminal-side via, the internal wiring layer, and the electricity supply via.

Also, electric power can be supplied from the conductive section for electricity supply to the one of the plurality of first heating elements (accordingly, the heat generation section) through the internal wiring layer. Notably, temperature control for each heating zone can be performed individually.

(4) In the above-described holding apparatus, the conductive section for electricity supply may be provided in the holding substrate to be located on a side toward a second main face of the holding substrate opposite the first main face.

As described above, the conductive section for electricity supply which is a structure for supplying electricity to the heat generation section may be disposed together on the second main face side of the holding apparatus. In this case, the structure for supplying electricity to the heat generation section is not required to be disposed on the first main face side of the holding apparatus. This is advantageous in that, for example, an electrostatic chuck including the ceramic heater can have a desired structure in which the first main face side of the ceramic heater is used as an attraction surface for attracting a semiconductor wafer.

(5) In the above-described holding apparatus, the electricity supply via and the first via may be disposed such that, in the plan view, the electricity supply via do not overlap with the first via at least partially.

The temperatures of regions where the electricity supply via and the first via are present in plan view become lower than the temperatures of portions of the heating elements within each heating zone where the electricity supply via and the first via are not present. In view of this, in this holding apparatus, the electricity supply via and the first via are disposed such that the electricity supply via do not overlap with the first via in plan view. As a result, the temperature distribution in each heating zone in the planar direction can be made uniform.

(6) In the above-described holding apparatus, the heat generation section may include a third heating element disposed at a position different from the position of the plurality of first heating elements and the position of the second heating element in the thickness direction, wherein the second heating element is electrically connected to the third heating element in series through a second via extending in the thickness direction, wherein the first via and the second via are disposed such that, in the plan view, the first via do not overlap with the second via at least partially.

In this holding apparatus, the plurality of first heating elements, the second heating element, and the third heating element are disposed, for example, in this order in three different planes (i.e., planes orthogonal to the thickness direction) arranged along the thickness direction; the one of the plurality of first heating elements is connected to the second heating element through the first via; and the second heating element is connected to the third heating element through the second via.

Also, the temperatures of regions where the first via and the second via are present in plan view become lower than the temperatures of portions of the heating elements within each heating zone where the first via and the second via are not present. In this holding apparatus, the first via and the second via which are low in temperature are disposed such that the first via do not overlap with the second via. Therefore, the temperature distribution in each heating zone in the planar direction can be made uniform.

Notably, n the case where a plurality of second heating elements are provided, there can be employed a structure in which respective third heating elements are connected to all of the plurality of second heating elements or a structure in which respective third heating elements are connected to a portion (i.e., one or some) of the plurality of second heating elements (the same shall apply hereinafter).

(7) In the above-described holding apparatus, the heat generation section may include a third heating element disposed at a position different from the position of the plurality of first heating elements and the position of the second heating element in the thickness direction, wherein the second heating element is electrically connected to the third heating element in series through a second via extending in the thickness direction. Further, the first via and the third heating element are disposed such that, in the plan view, the first via overlap with the third heating element at least partially, and the second via and the one of the plurality of first heating elements are disposed such that, in the plan view, the second via overlap with the one of the plurality of first heating elements at least partially.

In this holding apparatus, the plurality of first heating elements, the second heating element, and the third heating element are disposed, for example, in this order in three different planes arranged along the thickness direction; the one of the plurality of first heating elements is connected to the second heating element through the first via; and the second heating element is connected to the third heating element through the second via.

Further, in this holding apparatus, the first via whose temperature is relatively low within each heating zone and the third heating element whose temperature is relatively high within each heating zone are disposed such that the first via overlap with the third heating element at least partially, and the second via whose temperature is relatively low within each heating zone and the one of the plurality of first heating elements whose temperatures are relatively high within each heating zone are disposed such that the second via overlap with the one of the first heating element at least partially. Therefore, the temperature distribution in each heating zone in the planar direction can be made uniform.

(8) In the above-described holding apparatus, in the plan view, at least one of the plurality of first heating elements may have first portions disposed around the first via and a second portion which is more remote from the first via than the first portions, wherein an amount of heat generation per unit area of the first portions is larger than that of the second portion.

Since the temperatures of the vias are lower than the temperature of each heating element, the temperature distribution in each heating zone in the planar direction can be made uniform by rendering the amount of heat generation per unit area of the first portions disposed around the first via larger than that of the second portion which is disposed at a position separated from the areas around the first via.

<In Below, Examples of Structural Elements of the Present Disclosure Will be Described>

The holding substrate is a plate-shaped member. An example of the holding substrate is a ceramic substrate which contains ceramic as a main component (50% by mass or more). Another example of the holding substrate is a composite substrate in which a resin-made heater (for example, a plate-shaped heater) having a heating element disposed, for example, inside the heater is bonded to a main face of a ceramic substrate or the like.

Examples of this ceramic material include aluminum oxide (alumina), aluminum nitride, and yttrium oxide (yttria).

Main faces refer to main surfaces of the holding substrate which are located on opposite sides in the thickness direction and differ from side surfaces of the holding substrate which are located on opposite sides in directions orthogonal to the thickness direction. The main faces have surface areas greater than those of the side surfaces.

The conductive section for electricity supply is an electrically conductive portion which contains an electrically conductive material such as tungsten, molybdenum, or the like.

Each of the vias such as the first via and the second via is a structural element for establishing electrical continuity between opposite sides of a layer in the thickness direction. An example of such a via is a via formed by charging tungsten, molybdenum, or the like, as an electrically conductive material, in a hole (through hole) extending through the layer in the thickness direction thereof. Another example of such a via is a via formed by forming an electrically conductive layer of tungsten, molybdenum, or the like on an inner circumferential surface of the hole by plating or the like.

The heat generation section (accordingly, the heating element) is a resistance heating element which generates heat when energized. Examples of the material of this heating element include tungsten, tungsten carbide, molybdenum, molybdenum carbide, tantalum, and platinum.

The internal wiring layer is wiring for supplying electricity, not for heating as in the case of the first and second heating elements, although the internal wiring layer generates a small amount of heat when energized. Accordingly, as the internal wiring layer, there can be employed an internal wiring layer whose heat generation amount per unit area in plan view is sufficiently smaller than (for example, is equal to or less than one tenth of) those of the first and second heating elements. Alternatively, for example, an internal wiring layer whose area is greater than that of each heating zone (e.g., a heating zone having the smallest area) in plan view can be employed as the internal wiring layer.

An example of the unit area is 1 $mm^2$. An example of a method of increasing the amount of heat generation per unit area for the case where the heating element is a strip-shaped heating element is a well known method of reducing the sectional area of the heating element in the direction orthogonal to the extension direction of the heating element.

BRIEF DESCRIPTION OF THE DRAWINGS

FIG. 4A is a plan view showing a third heating element, FIG. 4B is a plan view showing a second heating element, FIG. 4C is a plan view showing a first heating element, and FIG. 4D is an explanatory view showing in plan view a state in which the first to third heating elements are superimposed.

FIGS. 7A to 7D show a ceramic heater of a second embodiment, wherein FIG. 7A is a plan view showing a second heating element, FIG. 7B is a plan view showing a first heating element, FIG. 7C is an explanatory view showing in plan view a state in which the first and second heating elements are superimposed, and FIG. 7D is an explanatory view schematically showing the state of connection between the first and second heating elements by cutting the ceramic heater in its thickness direction.

DESCRIPTION OF REFERENCE NUMERALS AND SYMBOLS

Figure 1:
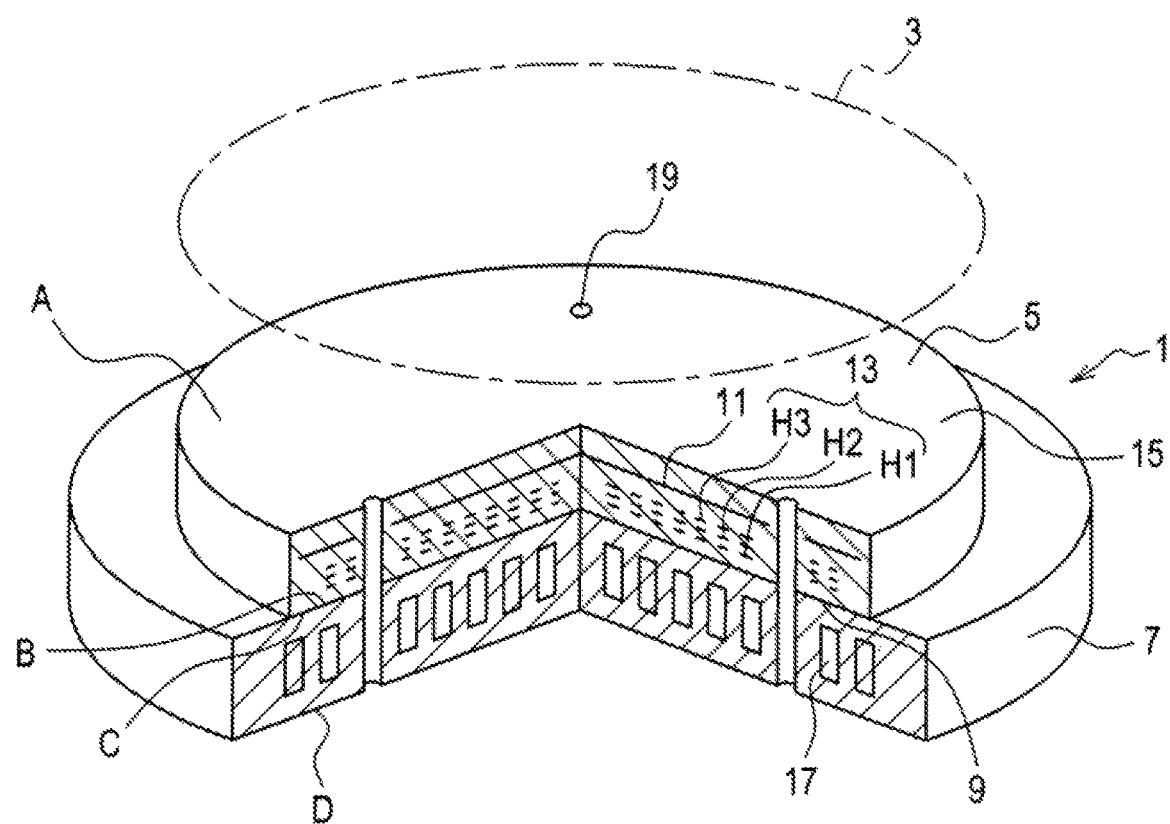
FIG. 1 is a perspective view of an electrostatic chuck of a first embodiment with its portion being cut away.

1 . . . electrostatic chuck
5 . . . ceramic heater
13 . . . heat generation section
15 . . . ceramic substrate
23 . . . conductive section for electricity supply
25a, 25b . . . electricity supply via
25c . . . terminal-side via
27 . . . internal wiring layer
H . . . series heating element
H1 . . . first heating element
H2 . . . second heating element
H3 . . . third heating element
V1 . . . first via
V2 . . . second via

MODES FOR CARRYING OUT THE INVENTION

Next, embodiments of the holding apparatus will be described.

1. First Embodiment

Here, a ceramic heater used in an electrostatic chuck which can attract and hold, for example, a semiconductor wafer will be described as a first embodiment of the holding apparatus.

[1-1. Overall Structure]

First, the structure of the electrostatic chuck of the present first embodiment will be described.

As shown in FIG. 1, the electrostatic chuck 1 of the present first embodiment is an apparatus which attracts a semiconductor wafer 3 (workpiece) on the upper side in FIG. 1. The electrostatic chuck 1 includes a ceramic heater 5 and a metal base 7 which are stacked and bonded together by an adhesive layer 9.

Notably, a surface (upper surface: attraction surface) of the ceramic heater 5 located on the upper side in FIG. 1 is a first main face A, and a lower surface of the ceramic heater 5 is a second main face B. Also, an upper surface of the metal base 7 is a third main face C, and a lower surface of the metal base 7 is a fourth main face D.

The ceramic heater 5 has a plate-like shape (specifically, a disk-like shape) and is composed of a plate-shaped (specifically, disk-shaped) ceramic substrate 15 which includes an attraction electrode (i.e., an electrostatic electrode) 11, a heat generation section 13, etc. Notably, the attraction electrode 11 and the heat generation section 13 are embedded in the ceramic substrate 15, and the ceramic substrate 15 is an insulating substrate having electrical insulation properties.

The metal base 7 has the shape of a disk having a diameter greater than that of the ceramic heater 5 and is coaxially joined to the ceramic heater 5. The metal base 7 has a flow channel (i.e., cooling channel) 17 to which a cooling fluid (i.e., refrigerant) is supplied so as to cool the ceramic substrate 15 (accordingly, the semiconductor wafer 3). Notably, for example, cooling liquid such as fluorocarbon liquid or pure water can be used as the cooling fluid.

The electrostatic chuck 1 has a plurality of holes such as lift pin holes 19 into which lift pins (not shown) are inserted. The plurality of holes extend through the electrostatic chuck 1 in the thickness direction thereof. The lift pin holes 19 are also used as flow channels (i.e., cooling gas holes) for a cooling gas which is supplied to the first main face A side so as to cool the semiconductor wafer 3.

Notably, cooling gas holes (not shown) may be provided separately from the lift pin holes 19. For example, an inert gas such as helium gas or nitrogen gas may be used as the cooling gas.

Next, the structures of the components of the electrostatic chuck 1 will be described in detail with reference to FIG. 2.

<Ceramic Heater>

Figure 2:
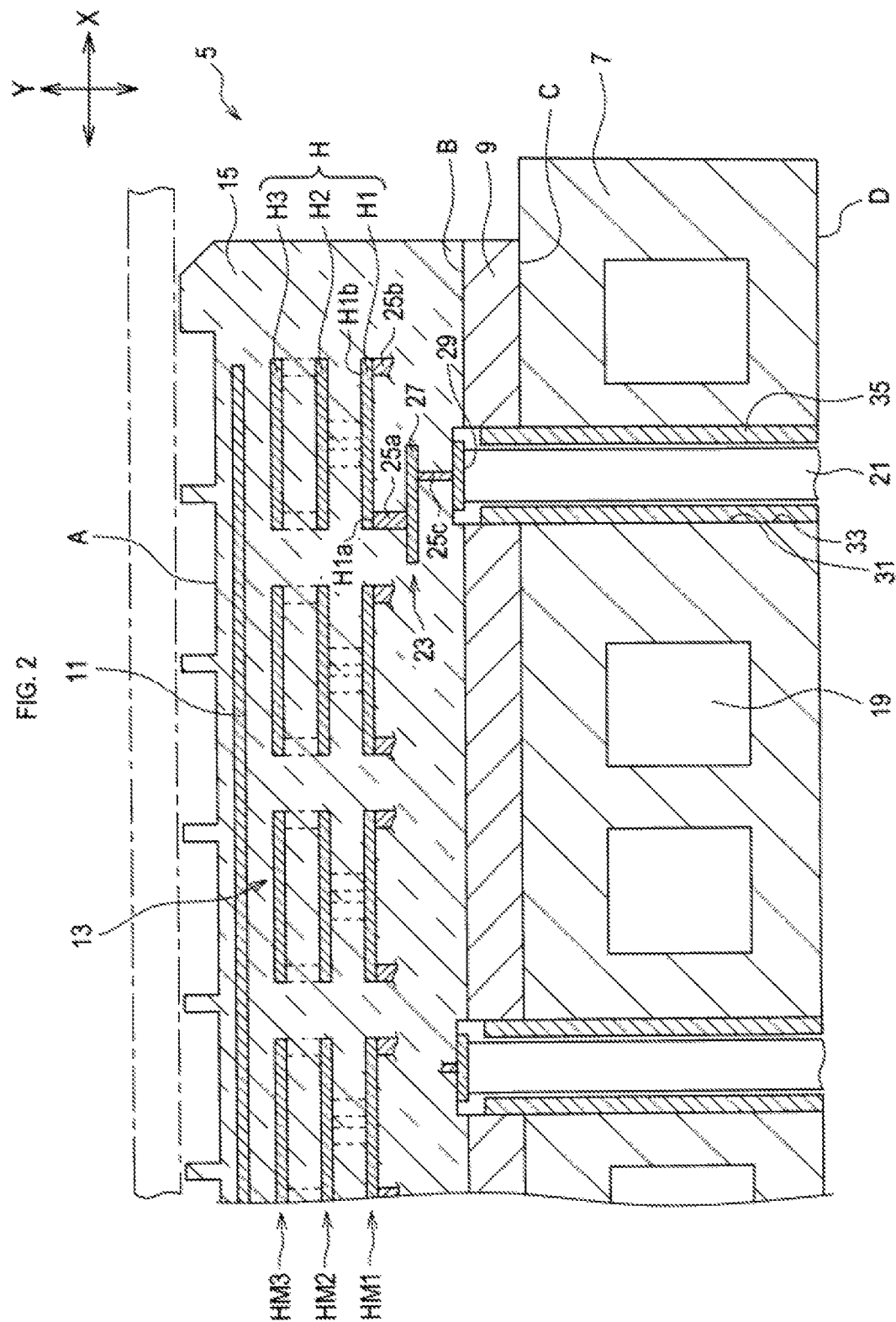
FIG. 2 is a sectional view schematically showing a portion of a section of the electrostatic chuck of the first embodiment, the section being obtained by cutting the electrostatic chuck in its thickness direction.

As schematically shown in FIG. 2, the second main face B of the ceramic heater 5 (accordingly, the ceramic substrate 15) is joined to the third main face C of the metal base 7 by the adhesive layer 9 formed of, for example, silicone.

The ceramic substrate 15 is formed by stacking a plurality of ceramic layers (not shown) in the vertical direction (Y-direction) in FIG. 2 and is an alumina sintered body whose main component is alumina. Notably, the alumina sintered body is an insulator (dielectric).

As will be described in detail later, a plurality of first heating elements H1, a plurality of second heating elements H2, a plurality of third heating elements H3, an attraction electrode 11, etc. are disposed in the ceramic substrate 15 in this order from the lower side in FIG. 2. Notably, in FIG. 2, the first to third heating elements H1 to H3 are shown schematically.

The plurality of first heating elements H1 are disposed in a first plane HM1, the plurality of second heating elements H2 are disposed in a second plane HM2, and the plurality of third heating elements H3 are disposed in a third plane HM3. Notably, the first to third planes HM1 to HM3 are planes which extend perpendicularly to the thickness direction of the ceramic substrate 15 (the vertical direction in FIG. 2: the Y-direction) at different positions which are spaced from one another by a predetermined distance in the thickness direction. Namely, the planes (i.e., the first to third planes HM1 to HM3) are parallel to one another, and the direction in which each plane extends is the planar direction. Notably, FIG. 2 shows a section along the X-direction orthogonal to the Y-direction.

One first heating element H1, one second heating element H2, and one third heating element H3 are electrically connected in series, whereby one heating element (hereinafter referred to as a series heating element) H is formed. The heat generation section 13 is formed by a plurality of series heating elements H.

As will be described later, the ceramic substrate 15 is divided into a plurality of heating zones KZ (see FIG. 3) in a plan view as viewed in the thickness direction. One series heating element H is disposed in each heating zone KZ. Namely, the ceramic substrate 15 has a structure in which the plurality of series heating elements H are arrayed in the plan view.

Each series heating element H (specifically, the first heating element H1 of each series heating element H in the lowermost layer) is electrically connected to corresponding terminals for electricity supply (i.e., electricity supply terminals) 21.

Namely, in order to allow individual temperature control, in each series heating element H, opposite ends (i.e., a pair of end portions H1a and H1b) of the first heating element H1 are electrically connected, through conductive sections 23 for electricity supply, to a pair of electricity supply terminals 21 on one side of the ceramic substrate 15 (i.e., the second main face B side).

As structural components for supplying electricity to the series heating element H, the conductive sections 23 for electricity supply includes electricity supply vias 25a and 25b, electrically conductive internal wiring layer 27, terminal-side via 25c, and terminal pads 29. The electricity supply terminals 21 are joined to the terminal pads 29.

In the conductive sections 23 for electricity supply, the terminal-side via 25c are electrically connected to the internal wiring layer 27, and the internal wiring layer 27 are electrically connected to the electricity supply vias 25a and 25b, and the electricity supply vias 25a and 25b are electrically connected to the end portions H1a and H1b of the first heating element H1. Notably, the conductive sections 23 for electricity supply are formed of, for example, tungsten.

The attraction electrode 11 is electrically connected to a well known electrode terminal (not shown) to which a voltage is applied.

<Metal Base>

The metal base 7 is formed of a metal such as aluminum or an aluminum alloy. In addition to the above-described cooling channels 17 and the above-described lift pin holes 19, penetration openings 31 are formed in the metal base 7. The penetration openings 31 are through holes in which the above-described electrode terminals and the above-described electricity supply terminals 21 are disposed.

Notably, on the fourth main face D side of the electrostatic chuck 1, a plurality of internal holes 33 extending from the fourth main face D to the interior of the ceramic heater 5 are provided so as to accommodate the electricity supply terminals 21. The penetration openings 31 of the metal base 7 partially constitute the internal holes 33.

Insulating tubes 35 having electrical insulation properties are disposed in the internal holes 33 which accommodate the electrode terminal and the electricity supply terminals 21.

<Attraction Electrode>

The attraction electrode 11 is composed of, for example, an electrode having a circular planar shape. When the electrostatic chuck 1 is used, a high DV voltage is applied to the attraction electrode 11. As a result, the attraction electrode 11 generates electrostatic attraction force (attraction force) for attracting the semiconductor wafer 3. The attraction electrode 11 attracts and fixes the semiconductor wafer 3 by using the generated attraction force.

Notably, the attraction electrode 11 is not limited to the above-described structure and may have any of various types of known structures (a monopolar electrode, a bipolar electrode, etc.). Notably, the attraction electrode 11 is formed of an electrical conductive material such as tungsten.

[1-2. Structure of Heating Element]

Next, the structure of the heat generation section 13, which is the essential part of the present first embodiment, will be described.

As shown in FIG. 2, the heat generation section 13 is composed of the plurality of series heating elements H arrayed in the planar direction orthogonal to the thickness direction of the ceramic substrate 15.

Each of the series heating elements H is formed by successively connecting in series the first heating element H1, the second heating element H2, the third heating element H3 disposed in different planes; i.e., the first to third planes HM1 to HM3, as described above. Accordingly, in the heat generation section 13, the corresponding second heating elements H2 are connected to all the first heating elements H1, and the corresponding third heating elements H3 are connected to all the second heating elements H2.

Notably, each of the first to third heating elements H1 to H3 is a resistance heating element which is formed of a metallic material (tungsten or the like) and which generates heat when current flows therethrough upon application of voltage.

Figure 3:
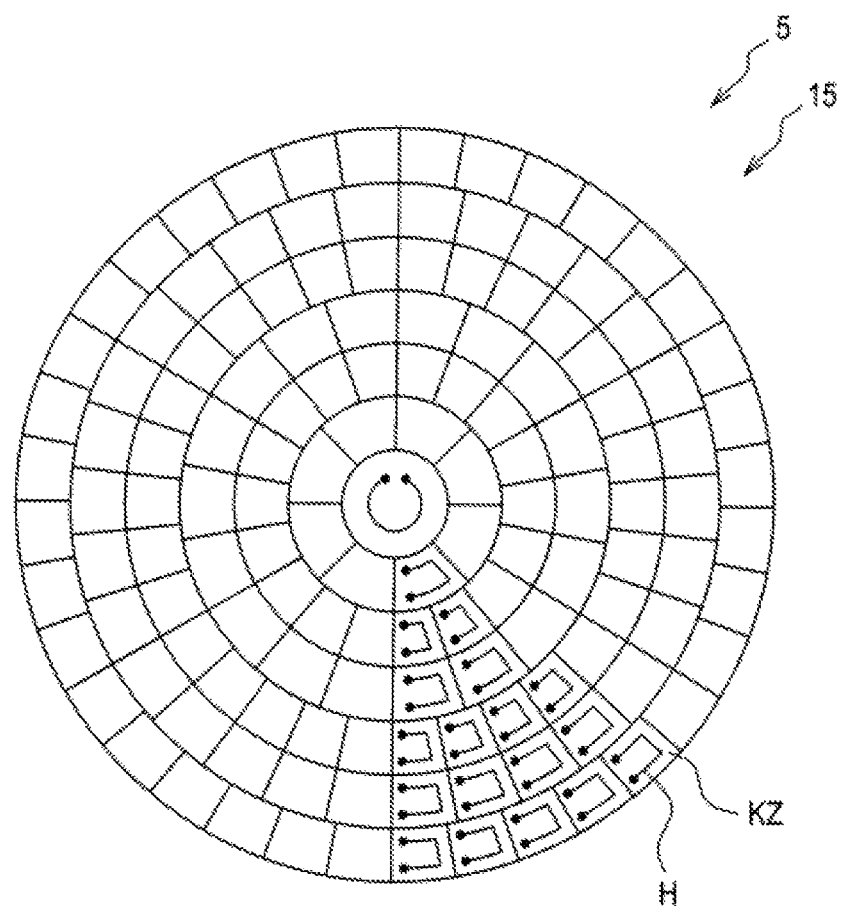
FIG. 3 is a plan view schematically showing the layout of a plurality of heating zones and series heating elements of a ceramic heater.

As shown in FIG. 3, a plurality of heating zones KZ are set on the ceramic substrate 15 (accordingly, on the ceramic heater 5) in plan view. One series heating element H having the above-described structure is disposed in each heating zone HZ, so that the temperature of each heating zone KZ can be adjusted independently.

Notably, the number of the heating zones KZ is, for example, 100 or greater (e.g., 200). In FIG. 3, the heating zones KZ are shown in a simplified manner (namely, the number of the heating zones KZ depicted is smaller than the actual number of the heating zones KZ). Also, in FIG. 3, only some of the series heating elements H are schematically shown.

<Planar Shapes of Heating Elements>

Next, the planar shapes of the first heating element H1, the second heating element H2, and the third heating element H3 will be described with reference to FIGS. 4A to 4D and FIG. 5.

As shown in FIG. 4A, in plan view, each third heating element H3, which is the uppermost layer closest to the first main face A, has a strip-shaped line portion L which is thin (for example, its line width is 1 mm or less) and meanders a plurality of times, and circular end portions H3a and H3b provided at opposite ends of the line portion L and having a diameter greater than the line width.

Portions (first portions) of the line portion L around the end portions H3a and H3b have a line width smaller than that of another portion (second portion) thereof which is more remote from the end portions H3a and H3b than the first portions. Notably, the portions (first portions) around the end portions H3a and H3b may be, for example, portions within concentric circular regions whose centers coincide with the centers of the end portions H3a and H3b, respectively, and which have a diameter 3 times the maximum diameter of the end portions H3a and H3b.

The amount of heat generation per unit area (e.g., 1 mm$^2$) of the first portion is larger than that of the second portion (the same shall apply hereinafter).

Figure 5:
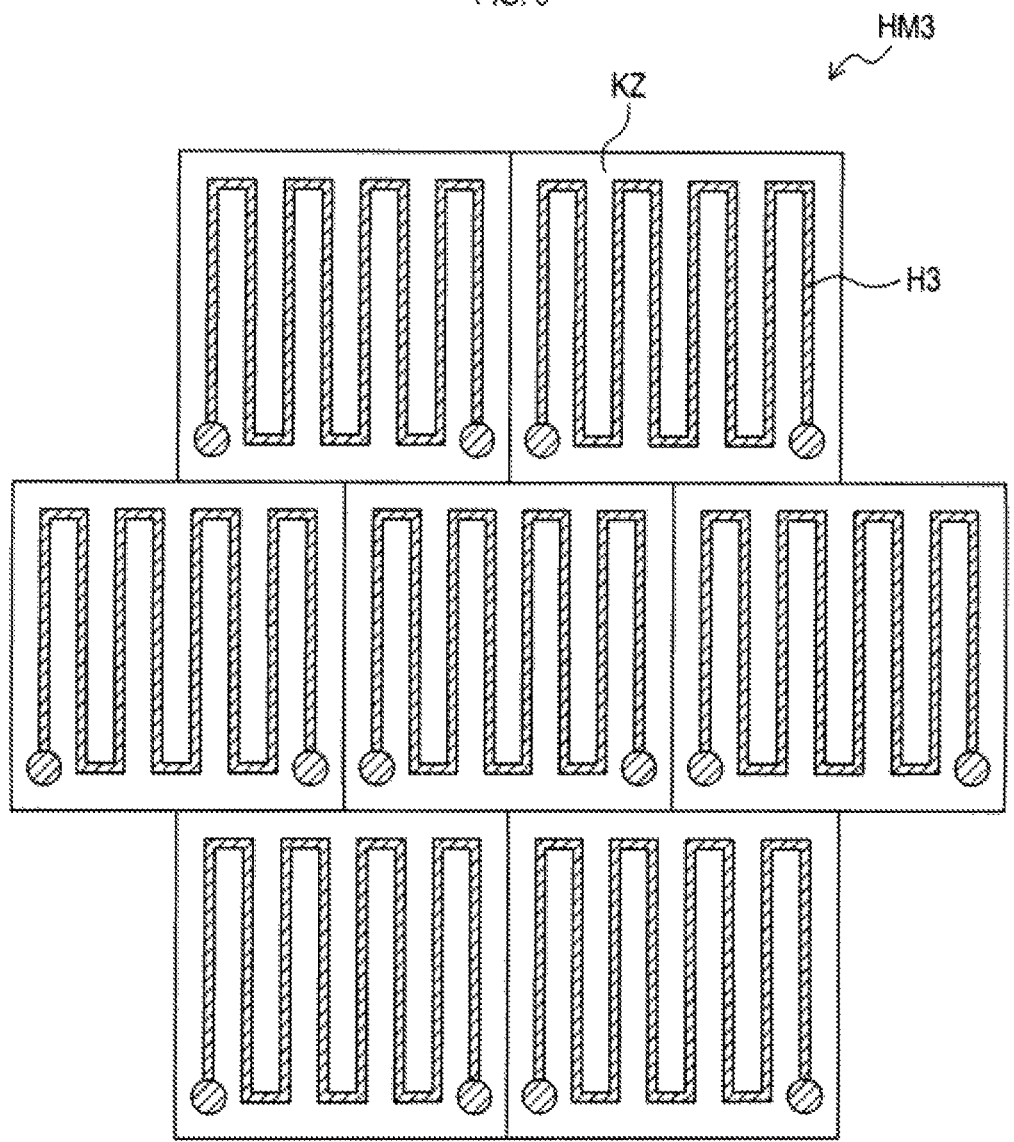
FIG. 5 is an explanatory view showing the layout of heating zones and third heating elements in a third plane.

Notably, as shown in FIG. 5, a large number of heating zones KZ are disposed in, for example, the third plane HM3 such that each heating zone KZ is located adjacent to other heating zones KZ, and one third heating element H3 is disposed in each heating zone KZ. Notably, in plan view, the heating zones KZ are arranged in the same layout and have the same planar shapes in other planes (the second and first planes HM2 and HM1).

As shown in FIG. 4B, each second heating element H2 disposed at an intermediate position has paired left and right partial heating elements H2l and H2r. Like the third heating element H3, the left partial heating element H2l has a strip-shaped line portion L which is thin (for example, its line width is 1 mm or less) and meanders a plurality of times, and circular end portions H2a and H2b provided at opposite ends of the line portion L and having a diameter greater than the line width. Similarly, the right partial heating element H2r has a strip-shaped line portion L which is thin (for example, its line width is 1 mm or less) and meanders a plurality of times, and circular end portions H2c and H2d provided at opposite ends of the line portion L and having a diameter greater than the line width.

As in the case of the third heating element H3, portions (first portions) of the line portion L of the left partial heating element H2l around the end portions H2a and H2b have a line width smaller than that of another portion (second portion) thereof which is more remote from the end portions H2a and H2b than the first portions. Notably, the portions (first portions) around the end portions H2a and H2b may be, for example, portions within concentric circular regions whose centers coincide with the centers of the end portions H2a and H2b, respectively, and which have a diameter 3 times the maximum diameter of the end portions H2a and H2b. Similarly, portions (first portions) of the line portion L of the right partial heating element H2r around the end portions H2c and H2d have a line width smaller than that of another portion (second portion) thereof which is more remote from the end portions H2c and H2d than the first portions. Notably, the portions (first portions) around the end portions H2c and H2d may be, for example, portions within concentric circular regions whose centers coincide with the centers of the end portions H2c and H2d, respectively, and which have a diameter 3 times the maximum diameter of the end portions H2c and H2d.

As shown in FIG. 4C, each first heating element H1, which is the lowermost layer closest to the second main face B, has paired left and right partial heating elements H1l and H1r. The left partial heating element H1l has a strip-shaped line portion L which is thin (for example, its line width is 1 mm or less) and meanders a plurality of times, and circular end portions H1a and H1b provided at opposite ends of the line portion L and having a diameter greater than the line width. Similarly, the right partial heating element H1r has a strip-shaped line portion L which is thin (for example, its line width is 1 mm or less) and meanders a plurality of times, and circular end portions H1c and H1d provided at opposite ends of the line portion L and having a diameter greater than the line width.

As in the case of the third heating element H3, portions (first portions) of the line portion L of the left partial heating element H1l around the end portions H1a and H1b have a line width smaller than that of another portion (second portion) thereof which is more remote from the end portions H1a and H1b than the first portions. Notably, the portions (first portions) around the end portions H1a and H1b may be, for example, portions within concentric circular regions whose centers coincide with the centers of the end portions H1a and H1b, respectively, and which have a diameter 3 times the maximum diameter of the end portions H1a and H1b. Similarly, portions (first portions) of the line portion L of the right partial heating element Sir around the end portions H1c and H1d have a line width smaller than that of another portion (second portion) thereof which is more remote from the end portions H1c and H1d than the first portions. Notably, the portions (first portions) around the end portions H1c and H1d may be, for example, portions within concentric circular regions whose centers coincide with the centers of the end portions H1c and H1d, respectively, and which have a diameter 3 times the maximum diameter of the end portions H1c and H1d.

The sectional area (i.e., "the width (dimension in a planar direction orthogonal to the extension direction of the line portion L)"×"the thickness (dimension in the thickness direction)") of the first portion at an arbitrary location is smaller than that of the second portion at an arbitrary location.

The sectional area (i.e., "the width (dimension in a planar direction orthogonal to the extension direction of the line portion L)"×"the thickness (dimension in the thickness direction)") of the line portion L is smaller than the sectional area (i.e., "the width (e.g., diameter) (dimension in a planar direction)"×"the thickness (dimension in the thickness direction)") of each of the end portions H3a, H3b, H2a, H2b, H2c, H2d, H1a, H1b, H1c, and H1d.

Notably, all the end portions H3a, H3b, H2a, H2b, H2c, H2d, H1a, H1b, H1c, and H1d are not required to have sectional areas greater than the sectional area of the line portion L, and it is sufficient that at least one of the end portions H3a, H3b, H2a, H2b, H2c, H2d, H1a, H1b, H1c, and H1d has a sectional area greater than the sectional area of the line portion L.

Accordingly, when the first to third heating elements H1 to H3 are viewed from the first main face A side in the thickness direction, the first to third heating elements H1 to H3 are located as shown in FIG. 4D. Notably, in FIG. 4D, the first to third heating elements H1 to H3 are shown in a superimposed manner.

Notably, in plan view, the amount of heat generation per unit area (e.g., 1 mm$^2$) of the first to third heating elements H1 to H3 is greater than the amount of heat generation per unit area of each internal wiring layer 27 (for example, 10 times or more the amount of heat generation per unit area of each internal wiring layer 27). Notably, the thickness of the first to third heating elements H1 to H3 is the same as the thickness of the internal wiring layer 27. Also, in plan view, the area of each internal wiring layer 27 is greater than the area of each heating zone KZ (for example, the area of the smallest heating zone KZ).

<Three-Dimensional Arrangement of Heating Elements>

Next, the positional relationship of the first heating element H1, the second heating element H2, and the third heating element H3 which are superimposed on one another will be described with reference to FIGS. 4A to 4D and FIG. 6. Notably, the arrangement of vias in FIG. 6 is made different from that in FIGS. 4A to 4D in some regions in order to facilitate their description.

Figure 6:
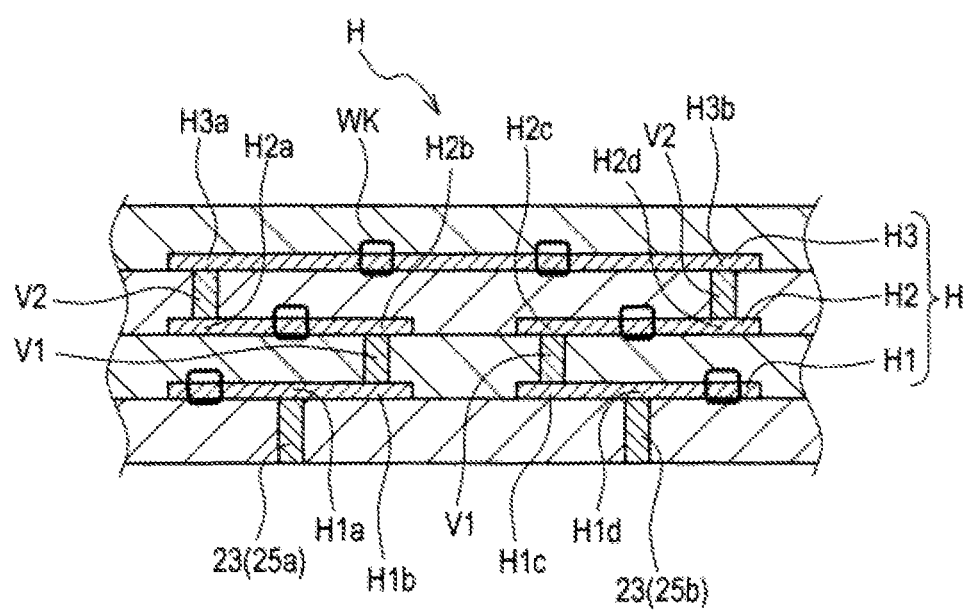
FIG. 6 is an explanatory view schematically showing the state of connection among the first to third heating elements by cutting the ceramic heater in its thickness direction.

As shown in FIGS. 4A to 4D and FIG. 6, the electricity supply vias 25a and 25b of the conductive sections 23 for electricity supply are connected to the end portions H1a and H1d of the first heating element H1 (specifically, the surfaces of the end portions H1a and H1d on the back side of the sheet on which FIGS. 4A to 4D are depicted: on the lower side in FIG. 6).

First via V1 are disposed between the end portions H1b and H1c of the first heating element H1 (specifically, the surfaces of the end portions H1b and H1c on the front side of the sheet on which FIGS. 4A to 4D are depicted: on the upper side in FIG. 6) and the end portions H2b and H2c of the second heating element H2 (specifically, the surfaces of the end portions H2b and H2c on the back side of the sheet on which FIGS. 4A to 4D are depicted: on the lower side in FIG. 6) so that end portions located at the same position in the planar direction are electrically connected together.

Further, second via V2 are disposed between the end portions H2a and H2d of the second heating element H2 (specifically, the surfaces of the end portions H2a and H2d on the front side of the sheet on which FIGS. 4A to 4D are depicted: on the upper side in FIG. 6) and the end portions H3a and H3b of the third heating element H3 (specifically, the surfaces of the end portions H3a and H3b on the back side of the sheet on which FIGS. 4A to 4D are depicted: on the lower side in FIG. 6) so that end portions located at the same position in the planar direction are electrically connected together.

Notably, broken line circles in FIG. 4A show the positions of the end portions H2b and H2c of the second heating element H2 in plan view, and broken line circles in FIG. 4B show the positions of the end portions His and H1d of the first heating element H1 in plan view.

As described above, as a result of disposition of the first to third heating elements H1 to H3 such that they are superimposed on one another in the thickness direction, the series heating element H is formed in which the first to third heating elements H1 to H3 are connected in series through the first via V1 and the second via V2.

As shown in FIG. 4D, in the present first embodiment, the electricity supply via 25a and 25b of the conductive sections 23 for electricity supply (i.e., the end portions H1a and H1d) are disposed such that they do not overlap with the pair of first via V1 in plan view.

The first via V1 and the second via V2 are disposed such that the first via V1 do not overlap with the second via V2 in plan view.

The first via V1 and the third heating element H3 are disposed such that the first via V1 partially overlap with the third heating element H3 in plan view. The second via V2 and the first heating element H1 are disposed such that the second via V2 partially overlap with the first heating element H1 in plan view.

The sectional area of each of the end portions H3a, H3b, H2a, H2b, H2c, H2d, H1a, H1b, H1c, and H1d in plan view (the sectional area is represented by radius×radius×π in the case where the section in the planar direction is circular) is greater than the sectional area of each of the first and second via V1 and V2 in plan view (the sectional area is represented by radius×radius×π in the case where the section in the planar direction is circular).

Therefore, it is desirable to satisfy the relation of the width of the line portion L in plan view (i.e., the width in a planar direction orthogonal to the extension direction) the width of the first and second via V1 and V2 in plan view (the diameter of the first and second via V1 and V2 in the case where their sections in the planar direction are circular)<the width of the end portions H3a, H3b, H2a, H2b, H2c, H2d, H1a, H1b, H1c, and H1d in plan view (the diameter of the end portions H3a, H3b, H2a, H2b, H2c, H2d, H1a, H1b, H1c, and H1d in the case where their sections in the planar direction are circular).

Since the above-described relationship is satisfied, the reliability of connection is enhanced. Further, the width of the line portion L is small, and the first to third heating elements H1 to H3 are stacked. Therefore, the resistance of the heating element (i.e., the series heating element) H can be increased).

Notably, in FIG. 6, locations in plan view where temperature is likely to become low; i.e., the locations where the electricity supply vias 25a and 25b and the first and second via V1 and V2 of the conductive sections 23 for electricity supply are disposed, are indicated by square frames WK.

Notably, the above-described vias; i.e., the electricity supply vias 25a and 25b, the terminal-side via 25c, the first and second via V1 and V2, etc. are electrically conductive portions which are formed by charging an electrically conductive material such as tungsten into penetration holes (namely, through holes) extending through the respective ceramic layers in the thickness direction as in the case of well known vias.

[1-3. Manufacturing Method]

Next, a method of manufacturing the electrostatic chuck 1 of the present first embodiment will be described briefly.

(1) Powder of $Al_2O_3$ (main component: 92% by weight), powder of MgO (1% by weight), powder of CaO (1% by weight), powder of $SiO_2$ (6% by weight), which are materials of the ceramic substrate 15, are mixed and wet-pulverized using a ball mill for 50 to 80 hours, followed by dewatering and drying.

(2) Next, a solvent, etc. are added to the resultant powder and are mixed by a ball mill to yield a slurry.

(3) Next, after removing bubbles from the slurry under reduced pressure, the slurry is dispensed to form a layer having a flat plate-like shape, followed by gradual cooling and evaporation of the solvent, whereby alumina green sheets which are to become the ceramic layers are formed.

Subsequently, spaces which are to become the lift pin holes 19, etc. and through holes for forming the vias 25a, 25b, 25c, V1, and V2 are formed in the alumina green sheets at prescribed locations.

(4) Further, tungsten powder is added to the material powder for the alumina green sheets, followed by mixing, whereby a slurry-like metallization ink is obtained.

(5) Subsequently, in order to form the attraction electrode 11, the first to third heating elements H1 to H3, the internal wiring layer 27, the terminal pads 29, etc., the metallization ink is printed in respective patterns, by an ordinary screen printing method, on the alumina green sheets at positions where the attraction electrode 11, the first to third heating elements H1 to H3, the internal wiring layer 27, the terminal pads 29, etc. are to be formed. Notably, in order to form the vias 25a, 25b, 25c, V1, and V2, the metallization ink is charged into the through holes.

(6) Next, the alumina green sheets are aligned such that necessary spaces such as the lift pin holes 19, etc. are formed, followed by thermo-compression bonding, whereby a laminate sheet is formed.

(7) Next, each laminate sheet having undergone thermo-compression bonding is cut into a predetermined shape (i.e., a disk-like shape).

(8) Next, each cut laminate sheet is fired (final firing) for five hours in a reducing atmosphere at a temperature in the range of 1,400 to 1,600° C. (e.g., 1,550° C.), whereby each alumina sintered body is completed.

(9) After the firing, necessary machining (for example, machining on the first main face A side) is performed for each alumina sintered body, whereby the ceramic substrate 15 is manufactured.

(10) Next, metallic terminal members (not shown) are brazed to the terminal pads 29 on the second main face B of the ceramic substrate 15.

(11) Separately, the metal base 7 is manufactured. Specially, the metal base 7 is formed by performing cutting or the like machining on a metal plate.

(12) Next, the metal base 7 and the ceramic substrate 15 are joined together for integration.

(13) Next, the electricity supply terminals 21, etc. are disposed in the internal holes 33 so as to complete the electrostatic chuck 1.

[1-4. Effects]

Next, the effects of the present first embodiment will be described.

(1) In the present first embodiment, the multi-zone ceramic heater 5 having a large number of heating zones KZ arranged in the planar direction is configured such that a plurality of first heating elements H1, a plurality of second heating elements H2, and a plurality of third heating elements H3 are respectively disposed at different positions in the thickness direction, each first heating element H1 is electrically connected to the corresponding one of the second heating elements H2 in series through the corresponding first via V1, and each second heating element H2 is electrically connected to the corresponding one of the third heating elements H3 in series through the corresponding second via V2. Accordingly, the resistance of the heating element (i.e., the series heating element) H formed by connecting the first to third heating elements H1 to H3 can be increased.

Namely, in such a multi-zone ceramic heater 5 having a large number of heating zones KZ arranged in the planar direction, when the number of the heating zones KZ increases, the area of each heating zone KZ decreases. Therefore, increasing the resistance of each single heating element is not easy. In contrast, in the present first embodiment, even when the area of a single heating zone in plan view decreases, the resistance of the series heating element H disposed in each single heating zone can be easily increased.

Therefore, even when the current value of current supplied to the series heating element H is decreased, a target heat generation amount can be secured. Thus, a remarkable effect of downsizing the apparatus for supplying the current is attained.

(2) In the present first embodiment, the structure for supplying electricity to the heat generation section 13 (specifically, each series heating element H) includes pairs of conductive sections 23 for electricity supply (specifically, the electricity supply vias 25a and 25b) which are electrically connected to the first heating element H1, wherein each pair of the conductive sections 23 for electricity supply are provided on one side of the ceramic substrate 15 in the thickness direction (the second main face B side).

Since the structural elements for electricity supply (for example, the terminal pads 29, parts connected thereto, etc.) can be disposed together on one side of the ceramic heater 5, the structural elements for electricity supply are not required to be disposed on the other side of the ceramic heater 5. This is advantageous in that the electrostatic chuck 1 can be configured as desired, for example, such that the other side of the ceramic heater 5 is used as an attraction surface for attracting the semiconductor wafer 3.

(3) In the present first embodiment, the electricity supply vias 25a and 25b and the first via V1 are disposed such that the electricity supply vias 25a and 25b do not overlap with the first via V1 in plan view.

Namely, since the temperatures of regions where the electricity supply vias 25a and 25b and the first via V1 are present in plan view become lower than that of a region where the line portion L of the series heating element H is formed, in the present first embodiment, the electricity supply vias 25a and 25b and the first via V1 are disposed such that the electricity supply vias 25a and 25b do not overlap with the first via V1 in plan view. Therefore, the temperature distribution in each heating zone KZ in the planar direction can be made uniform.

(4) In the present first embodiment, the first via V1 and the second via V2 whose temperatures become low are disposed such that the first via V1 do not overlap with the second via V2 in plan view. Therefore, the temperature distribution in each heating zone KZ in the planar direction can be made uniform.

(5) In the present first embodiment, the first via V1 whose temperatures become low and the third heating element H3 whose temperatures become high are disposed such that the first via V1 partially overlap with the third heating element H3, and the second via V2 whose temperatures become low and the first heating element H1 whose temperatures become high are disposed such that the second via V2 partially overlap with the first heating element H1. Therefore, the temperature distribution in each heating zone KZ in the planar direction can be made uniform.

(6) In the present first embodiment, the amount of heat generation per unit area of portions (i.e., first portions) of each of the first to third heating elements H1 to H3, which portions are located, in plan view, around the first or second via V1, V2 whose temperatures become low is greater than that of a portion (i.e., second portion) thereof which is more remote from the first or second via V1, V2 than the first portions. Therefore, the temperature distribution in each heating zone KZ in the planar direction can be made uniform.

[1-5. Relation of terms]

The ceramic heater 5, the heat generation section 13, the ceramic substrate 15, the conductive sections 23 for electricity supply, the electricity supply vias 25a and 25b, the terminal-side via 25c, the internal wiring layer 27, the first heating elements H1, the second heating elements H2, the third heating elements H3, the first via V1, and the second via V2 of the present first embodiment respectively correspond to the holding apparatus, the heat generation section, the holding substrate, the electricity supply conductive section, the electricity supply via, the terminal-side via, the internal wiring layer, the first heating elements, the second heating elements, the third heating elements, the first via, and the second via of the present disclosure.

2. Second Embodiment

Next, a second embodiment will be described. Descriptions of configurational features identical with those of the first embodiment will be omitted or simplified. Notably, the structural elements identical with those of the first embodiment are denoted by the same reference numerals.

In the present second embodiment, two heating elements are disposed at different positions in the thickness direction.

Figure 7A:
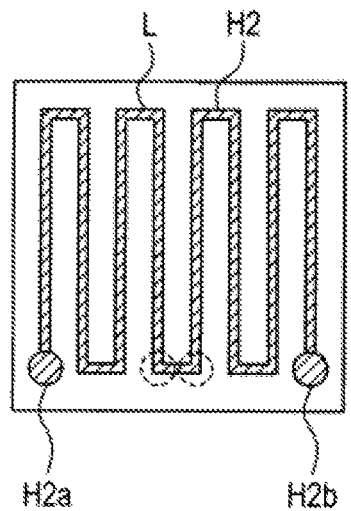
Figure 7B:
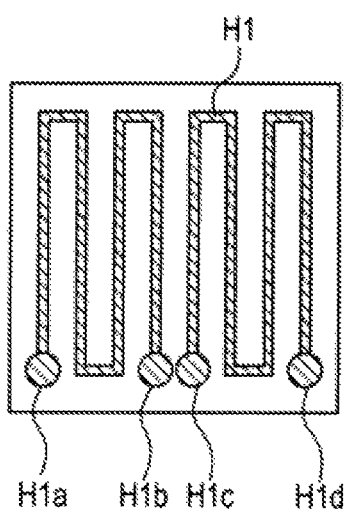
Figure 7C:
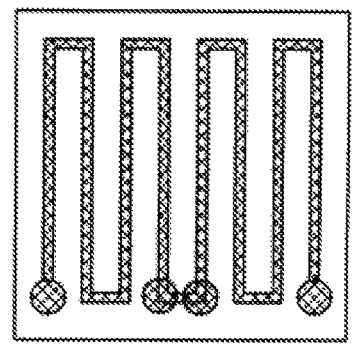

As shown in FIGS. 7A and 7B, in the second embodiment, a second heating element H2 having a shape similar to that of the third heating element H3 of the first embodiment is provided on the first main face A side of the ceramic heater 5. Also, a first heating element H1 having a shape similar to that of the second heating element H2 of the first embodiment is provided on the second main face B side of the ceramic heater 5. When the first and second heating elements H1 and H2 are viewed from the first main face A side in the thickness direction, the first and second heating elements H1 and H2 are located as shown in FIG. 7C. Notably, in FIG. 7C, the first and second heating elements H1 and H2 are shown in a superimposed manner.

Figure 7D:
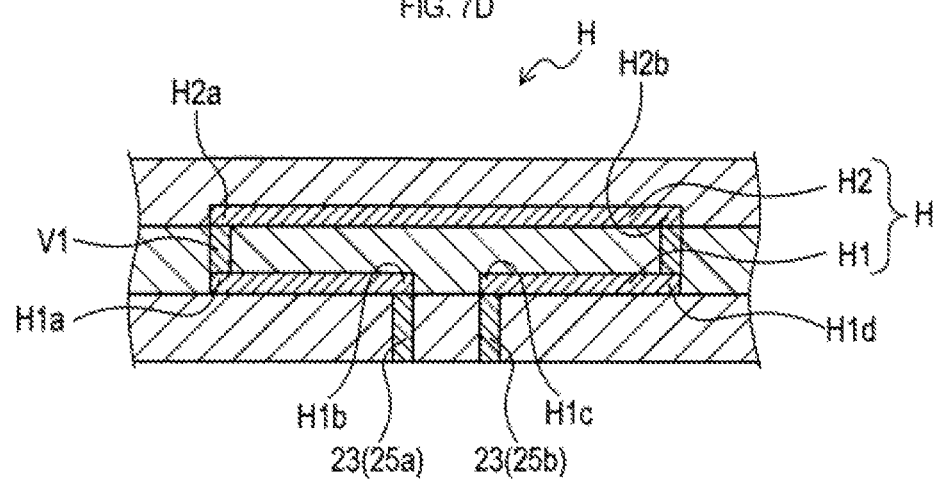

As shown in FIG. 7D, the electricity supply vias 25a and 25b of the conductive sections 23 for electricity supply are electrically connected to the end portions H1b and H1c, respectively, of the first heating element H1. Also, the end portions H1a and H1d of the first heating element H1 are electrically connected to the end portions H2a and H2b, respectively, of the second heating element H2 through the first via V1.

As a result, the series heating element H is formed.

The present second embodiment achieves an effect similar to the effect of the first embodiment.

3. Other Embodiments

Needless to say, the present disclosure is not limited to the above-described embodiments and can be implemented in various other forms without departing from the present disclosure.

(1) For example, the number of heating elements arranged in the thickness direction is not limited to 2 or 3 and may be greater than 3.

(2) The chuck for which the ceramic heater is used is not limited to electrostatic chucks, and the ceramic heater may be used for other applications such as vacuum chucks.

(3) The present disclosure can be applied to an electrostatic chuck which includes no metal base. Namely, the present disclosure can be applied to an electrostatic chuck in which an attraction electrode and a plurality of heating elements (for example, first to third heating elements) are provided in its ceramic heater.

(4) The present disclosure can be applied to a separate ceramic heater which is not incorporated into an electrostatic chuck or the like. For example, the present disclosure can be applied to a ceramic heater in which a plurality of heating elements, etc. similar to those of the above-described embodiments are provided in its ceramic substrate.

Figure 8:
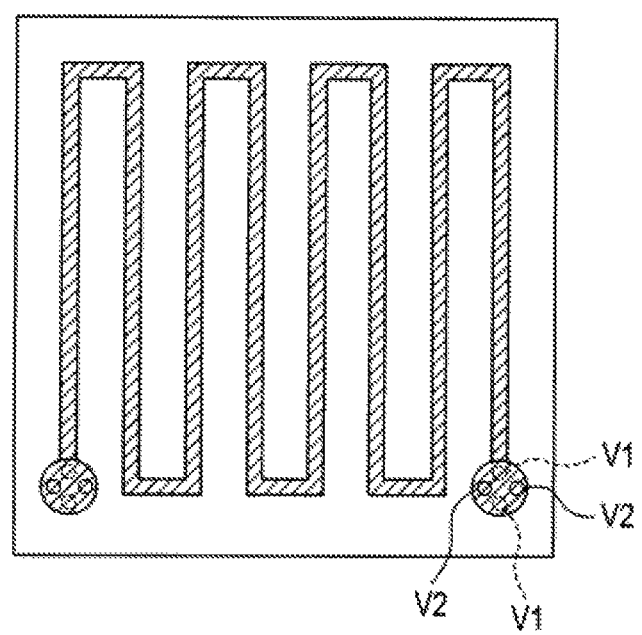
FIG. 8 is a plan view showing a second heating element of a ceramic heater of a modification.

(5) In the above-described embodiment, each of the first via V1 and the second via V2 may be composed of a single via or a via group including a plurality of vias as shown in FIG. 8. The plurality of vias enhance the connection reliability. Notably, in FIG. 8, the positions of the second via V2 on the attraction surface side are indicated by continuous line circles, and the positions of the first via V1 on the metal base side are indicated by broken line circles.

(6) In the present disclosure, there can be employed a structure in which respective second heating elements are connected to all of the plurality of first heating elements or a structure in which respective second heating elements are connected to a portion (namely, one or some) of the plurality of first heating elements. Further, in the case where a plurality of second heating elements are present, there can be employed a structure in which respective third heating elements are connected to all of the plurality of second heating elements or a structure in which respective third heating elements are connected to a portion (namely, one or some) of the plurality of second heating elements.

(7) Instead of the above-described structure of the ceramic heater, there can be employed a structure in which a resin heater including heating elements is stacked on a ceramic layer.

For example, there can be employed a structure in which, for example, a first layer (i.e., a ceramic layer) including an electrostatic electrode and a second layer (i.e., a resin heater) are stacked. The electrostatic electrode is provided in the ceramic layer or on its surface (surface on the resin heater side). The second layer is a resin layer which is formed of, for example, polyimide and in which the first to third heating elements, the internal wiring layer, the vias, etc. are disposed as in the above-described embodiments.

(8) Notably, the function of one constituent element in the above embodiments may be distributed to a plurality of constituent elements, or the functions of a plurality of constituent elements may be realized by one constituent element. Part of the configurations of the above embodiments may be omitted. Also, at least part of the configuration of each of the above embodiments may be added to or partially replace the configurations of other embodiments. Notably, all modes included in the technical idea specified by the wording of the claims are embodiments of the present disclosure.

(9) In another example of the present disclosure, for example, the following structure can be employed.

For example, there can be employed a "structure in which heating elements connected through vias (for example, first and second via) and constituting a single heat generation section are disposed in three or more different planes, and, of the vias each connecting together heating elements adjacent to each other in the thickness direction, the vias provided in different positions in the thickness direction are disposed such that, in plan view, they do not overlap with one another at least partially."

For example, there can be employed a "structure in which heating elements connected through vias (for example, first and second via) and constituting a single heat generation section are disposed in three or more different planes, and the vias connecting together heating elements located adjacent to each other in the thickness direction and another heating element which is not located adjacent thereto in the thickness direction are disposed such that, in plan view, the vias overlap with the another heating element at least partially."

The invention claimed is:

1. A holding apparatus comprising a holding substrate having a first main face on one side in a thickness direction orthogonal to the first main face, and a heat generation section which is disposed in the holding substrate and generates heat when energized, the holding apparatus being characterized in that
the heat generation section includes a plurality of first heating elements arrayed in a planar direction orthogonal to the thickness direction of the holding substrate, and a second heating element disposed on a side toward the first main face in the thickness direction with respect to the plurality of first heating elements; and
any one of the plurality of first heating elements is electrically connected to the second heating element in series through a first via extending in the thickness direction within the holding substrate,
wherein the heat generation section includes a third heating element disposed at a position different from the position of the plurality of first heating elements and the position of the second heating element in the thickness direction,
wherein the second heating element is electrically connected to the third heating element in series through a second via extending in the thickness direction, and
wherein the first via and the third heating element are disposed such that, when viewed from the first main face side of the holding substrate, the first via overlaps with the third heating element at least partially, and the second via and the one of the plurality of first heating elements are disposed such that, when viewed from the first main face side of the holding substrate, the second via overlaps with the one of the plurality of first heating elements at least partially.

2. A holding apparatus according to claim 1, wherein the holding substrate is divided into a plurality of heating zones when viewed from the first main face side of the holding substrate, and the one of the plurality of first heating elements and the second heating element are disposed in at least one of the plurality of heating zones.

3. A holding apparatus according to claim 1, further comprising a conductive section for electricity supply electrically connected to a terminal which receives externally supplied electric power, wherein
the conductive section for electricity supply includes:
an electricity supply via electrically connected to the one of the plurality of first heating elements;
an electrically conductive internal wiring layer electrically connected to the electricity supply via; and
a terminal-side via electrically connected to the internal wiring layer and electrically connected to the terminal.

4. A holding apparatus according to claim 3, wherein the conductive section for electricity supply is provided in the holding substrate to be located on a side toward a second main face of the holding substrate opposite the first main face.

5. A holding apparatus according to claim 3, wherein the electricity supply via and the first via are disposed such that, when viewed from the first main face side of the holding substrate, the electricity supply via does not overlap with the first via at least partially.

6. A holding apparatus comprising a holding substrate having a first main face on one side in a thickness direction orthogonal to the first main face, and a heat generation section which is disposed in the holding substrate and generates heat when energized, the holding apparatus being characterized in that
the heat generation section includes a plurality of first heating elements arrayed in a planar direction orthogonal to the thickness direction of the holding substrate, and a second heating element disposed on a side toward the first main face in the thickness direction with respect to the plurality of first heating elements; and
any one of the plurality of first heating elements is electrically connected to the second heating element in series through a first via extending in the thickness direction within the holding substrate,
wherein when viewed from the first main face side of the holding substrate, at least one of the plurality of first heating elements has first portions disposed around the first via and a second portion which is more remote from the first via than the first portions, and
wherein an amount of heat generation per unit area of the first portions is larger than that of the second portion.

7. A holding apparatus according to claim 6, wherein the holding substrate is divided into a plurality of heating zones when viewed from the first main face side of the holding substrate, and the one of the plurality of first heating elements and the second heating element are disposed in at least one of the plurality of heating zones.

8. A holding apparatus according to claim 6, further comprising a conductive section for electricity supply electrically connected to a terminal which receives externally supplied electric power, wherein
the conductive section for electricity supply includes:
an electricity supply via electrically connected to the one of the plurality of first heating elements;
an electrically conductive internal wiring layer electrically connected to the electricity supply via; and
a terminal-side via electrically connected to the internal wiring layer and electrically connected to the terminal.

9. A holding apparatus according to claim 8, wherein the conductive section for electricity supply is provided in the holding substrate to be located on a side toward a second main face of the holding substrate opposite the first main face.

10. A holding apparatus according to claim 8, wherein the electricity supply via and the first via are disposed such that, when viewed from the first main face side of the holding substrate, the electricity supply via does not overlap with the first via at least partially.

11. A holding apparatus according to claim 6, wherein the heat generation section includes a third heating element disposed at a position different from the position of the plurality of first heating elements and the position of the second heating element in the thickness direction,
wherein the second heating element is electrically connected to the third heating element in series through a second via extending in the thickness direction, and
wherein the first via and the second via are disposed such that, when viewed from the first main face side of the holding substrate, the first via does not overlap with the second via at least partially.

12. A holding apparatus comprising a holding substrate having a first main face on one side in a thickness direction orthogonal to the first main face, and a heat generation section which is disposed in the holding substrate and generates heat when energized, the holding apparatus being characterized in that
the heat generation section includes a plurality of first heating elements arrayed in a planar direction orthogonal to the thickness direction of the holding substrate, and a second heating element disposed on a side toward the first main face in the thickness direction with respect to the plurality of first heating elements; and
any one of the plurality of first heating elements is electrically connected to the second heating element in series through a first via extending in the thickness direction within the holding substrate,
wherein any one of the plurality of first heating elements and the second heating element are electrically connected in series, through the first via extending in the thickness direction within the holding substrate, so as to form a serial heating element, and
wherein the holding substrate is divided into a plurality of heating zones when viewed from the first main face side of the holding substrate, and a plurality of the serial heating elements are disposed in the heating zones such that one serial heating element is disposed in each heating zone, whereby the temperatures of the heating zones can be adjusted independently from one another,
wherein the heat generation section includes a third heating element disposed at a position different from the position of the plurality of first heating elements and the position of the second heating element in the thickness direction,
wherein the second heating element is electrically connected to the third heating element in series through a second via extending in the thickness direction, and
wherein the first via and the second via are disposed such that, when viewed from the first main face side of the holding substrate, the first via does not overlap with the second via at least partially.

13. A holding apparatus according to claim 12, wherein the holding substrate is divided into a plurality of heating zones when viewed from the first main face side of the holding substrate, and the one of the plurality of first heating elements and the second heating element are disposed in at least one of the plurality of heating zones.

14. A holding apparatus according to claim 12, further comprising a conductive section for electricity supply electrically connected to a terminal which receives externally supplied electric power, wherein
the conductive section for electricity supply includes:
an electricity supply via electrically connected to the one of the plurality of first heating elements;
an electrically conductive internal wiring layer electrically connected to the electricity supply via; and
a terminal-side via electrically connected to the internal wiring layer and electrically connected to the terminal.

15. A holding apparatus according to claim 14, wherein the conductive section for electricity supply is provided in the holding substrate to be located on a side toward a second main face of the holding substrate opposite the first main face.

16. A holding apparatus according to claim 14, wherein the electricity supply via and the first via are disposed such that, when viewed from the first main face side of the holding substrate, the electricity supply via does not overlap with the first via at least partially.

* * * * *